United States Patent [19]

Hatano

[11] 3,715,746

[45] Feb. 6, 1973

[54] KEYBOARD INPUT DEVICE

[75] Inventor: Isao Hatano, Kyoto-fu, Japan

[73] Assignee: Omron Tateisi Electronics, Co., Kyoto, Japan

[22] Filed: March 10, 1971

[21] Appl. No.: 122,667

[52] U.S. Cl. .................340/365 S, 197/98, 235/145, 340/166, 340/347 DD

[51] Int. Cl. .............................................H04q 3/00

[58] Field of Search.........340/365, 166 R, 347 DD, 365 S, 340/365 E; 178/17 R; 235/155, 154

[56] References Cited

UNITED STATES PATENTS

| | | | |
|---|---|---|---|
| 3,483,553 | 12/1969 | Blankenbaker | 340/365 |
| 3,594,781 | 7/1971 | Gerjets | 340/347 DD |
| 3,400,389 | 9/1968 | Heymann | 340/347 DD |
| 3,307,148 | 2/1967 | Fukamachi | 340/347 DD |
| 3,551,616 | 12/1970 | Juliusberger | 340/365 X |
| 3,541,547 | 11/1970 | Abramson et al | 340/347 DD |

*Primary Examiner*—John W. Caldwell
*Assistant Examiner*—Robert J. Mooney
*Attorney*—Craig, Antonelli, Stewart & Hill

[57] ABSTRACT

An input device comprising a keyboard circuit arrangement and an input signal converting circuit unit wherein junction terminals therebetween are advantageously reduced to a small number. To this end, the key contacts disposed in the keyboard are divided into a plurality of groups according to the number of timing pulses employed while the signal converting circuit unit is constructed with a plurality of matrices, portions of which are adapted to receive input signals from the keyboard through corresponding group terminals.

11 Claims, 2 Drawing Figures

Figure 1:
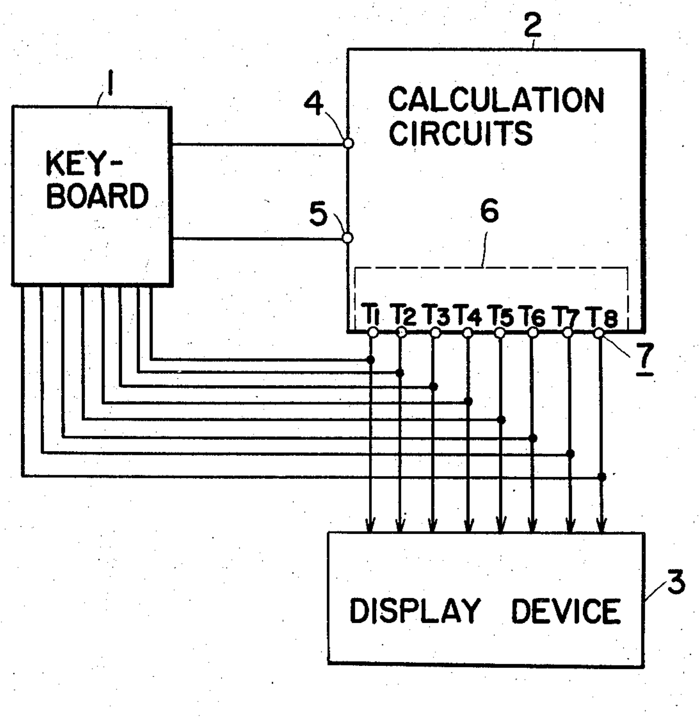

INVENTOR
ISAO HATANO
BY Craig, Antonelli, Stewart & Hill
ATTORNEYS

INVENTOR

ISAO HATANO

BY Craig, Antonelli, Stewart & Hill
ATTORNEYS

KEYBOARD INPUT DEVICE

The present invention relates to an input device of the type generally employed in an electronic desk calculator and, more particularly, to such an input device having a plurality of contact circuits associated with the corresponding number of character keys wherein the number of junctions between the contact circuits and lines of a circuit unit to which an input signal is applied from any one of the contact circuits is advantageously reduced.

In an electronic desk calculator having a plurality of character keys disposed on its key board, it has been well known that, if each contact circuit associated with the corresponding key is to be connected with the corresponding line of an input signal converting circuit unit capable of encoding within a binary frame input signals generated upon completion of the contact circuits, a plurality of terminals corresponding at least to the number of the contact circuits will be necessitated in the input signal converting circuit.

However, recently large scale integrated circuits (LSI) have been employed in an electronic calculator to reduce the size of the calculator and to facilitate a replacement of the damaged circuit component thereof and even the input signal converting circuit unit as hereinabove referred to is employed in the form of a large scale integrated circuit.

If the large scale integrated circuit is employed for the input signal converting circuit unit of the electronic calculator of the character above referred to, the conventional design practice is such that the large scale integrated circuit must be provided with a plurality of terminals each adapted to be connected with the corresponding contact circuit. The greater the number of terminals, the higher the manufacturing cost will become, resulting in that the circuit unit will become expensive.

Accordingly, the present invention has for its essential object the provision of an input device of the type above referred to including a plurality of key contacts each adapted to be closed upon operation of the corresponding key and disposed on the keyboard and an input signal converting circuit unit, wherein the number of junctions necessitated between the output terminal of the key contacts to input lines of the signal converting circuit unit is advantageously reduced to a minimum value.

To this end, according to the present invention, the key contacts disposed in the keyboard are divided into at least one or more groups each group consisting of the number of key contacts corresponding to the number of timing pulses to be applied to the input signal converting circuit unit so that one output terminal is provided for each group. On the other hand, the input signal converting circuit to which the timing pulses are applied is designed so as to comprise a first matrix having a plurality of output lines corresponding to the total number of character keys disposed on the keyboard of the electronic calculator and to which the respective timing pulses are directly applied, a plurality of second matrices, the number of which corresponds to the number of groups of the key contacts, and each being adapted to receive an input signal from the keyboard through the corresponding output terminal of the relevant group, and a third or encoder matrix adapted to convert the input signal into binary coded signals.

In this instance as provided by the present invention, the second matrices are designed such that, when a certain character key associated with the key contact belonging to a specific group is operated, a relevant timing pulse corresponding to the operated character key can be directly applied to output lines of one of said matrices associated with the group terminal, while the output lines of the remaining matrices are applied with signals generated by corresponding inverters, so that binary coded signals representing the character key that has been operated can be obtained by the application of a logical product of these signals to the encoder matrix.

Accordingly, the input signal converting circuit unit may be only provided with input terminals of the number corresponding to the sum of the number of the timing pulses employed and the number of group terminal, so that the large scale integrated circuit which may be substituted for the signal converting circuit unit can be manufactured at low cost, resulting in cut-down of the price of each electronic calculator of the character above referred to.

Figure 2:
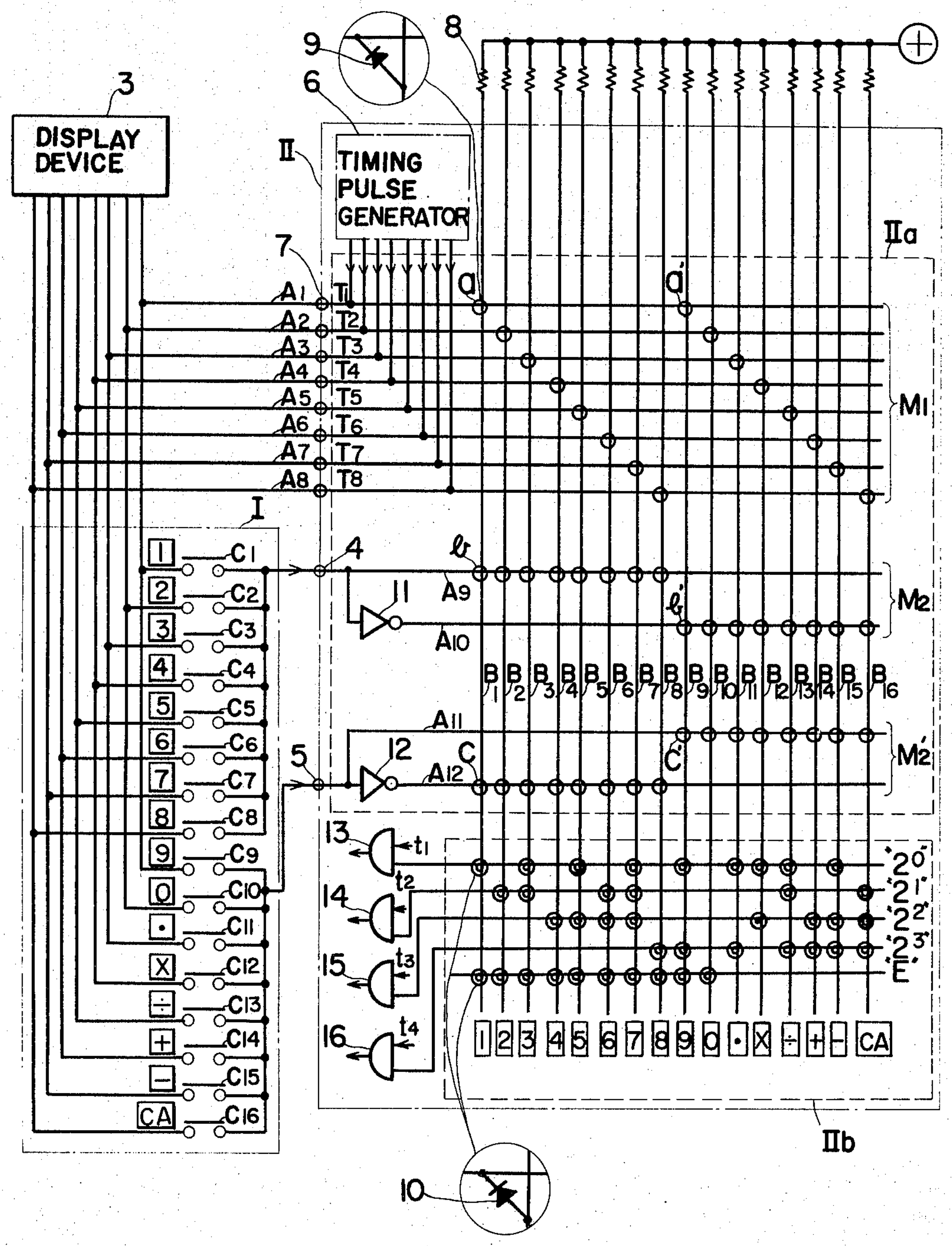

The present invention will be hereinafter fully described in conjunction with a preferred embodiment of the present invention taken only for the purpose of illustration thereof with reference to the accompanying drawings, in which;

FIG. 1 is a schematic block diagram of a circuit arrangement of an electronic calculator embodying the present invention and FIG. 2 is a detailed diagram showing a circuitry of portions of FIG. 1 to which the present invention is particularly directed.

It is to be noted that, for the sake of brevity, the present invention will be hereinafter fully disclosed in connection with an electronic calculator having 16 character keys on its keyboard with a timing pulse generator effective to generate 8 timing pulses to be fed through individual lines in succession during one step of operation.

Referring now to FIG. 1, reference character 1 is a keyboard; 2 is calculation circuitry including a timing pulse generator 6 effective to generate timing pulses T1 and T8, which reference characters are also employed to designate lines through which the timing pulses are transferred; 3 is a display device including a plurality of read-out tubes (not shown) for illuminating a decimal figure that has been entered in the calculator; and 4 and 5 are junction terminals provided for connecting the keyboard 1 and the calculation circuitry 2. However, it is to be noted that, in the case where the calculation circuitry 2 is employed in the form of a large scale integrated circuit, it is a usual design practice to incorporate the timing pulse generator 6 into such large scale integrated circuit together with said calculation circuitry 2. Hence, according to the present invention, the timing pulse generator 6 is included in the calculation circuitry 2.

The timing pulses T1 to T8 are adapted to be generated by the timing pulse generator 6 in the specified order successively during one step of operation. It is to be noted here that the pulse length of each of the timing pulses T1 to T8 corresponds to the sum of clock pulse lengths included in one clock pulse train $t_1$, $t_2$, $t_3$ and $t_4$ representing one decimal digit or arithmetic symbol that has been entered into the electronic calculator, this design practice being well known in the art.

Referring now to FIG. 2, the keyboard 1 comprises a keyboard circuit arrangement I including a plurality of key contacts $C_1$ to $C_{16}$ operably associated with the respective character keys and the calculation circuitry 2 comprises an input signal converting circuit unit II including an "and" circuit II*a* and an "or" circuit II*b*. Junction terminals as generally indicated by 7 are adapted to connect lines T1 to T8 with the input signal converting circuit unit II.

In the instance as shown wherein the keyboard comprises 16 character keys and the timing pulse generator is capable of generating 8 timing pulses T1 to T8, the keys are divided into two groups according to the number of the timing pulses. In other words, since the 8 timing pulses are provided, each of the groups thus divided comprises eight character keys, output terminals of key contacts of each group $C_1$ to $C_8$ and $C_9$ to $C_{16}$ being connected with one another to provide the group terminals 4 and 5, respectively, as shown.

The "and" circuit II*a* and the "or" circuit II*b* are respectively constructed with diode matrices in which each single or double circle at intersections of lines denotes a diode or MOS (metal-oxide-semiconductor) connected as illustrated in enlarged portions of FIG. 2. The input lines $A_1$ to $A_{12}$ of the "and" circuit II*a* are respectively adapted to receive input signals of positive polarity while the output lines $B_1$ to $B_{16}$ of the "and" circuit II*a* which also serve as corresponding input lines of the "or" circuit II*b* are adapted to receive power of positive polarity from a power source through respective resistors 8.

It is to be noted that each diode 9 disposed on the output lines $B_1$ to $B_{16}$ of the "and" circuit II*a* acts to produce an "and" output through three diodes on the same output line, for example, diodes *a*, *b* and *c* on the output line $B_1$, while each diode 10 disposed on the input lines of the "or" circuit II*b* which are concurrently served by the output lines $B_1$ to $B_{16}$ of the "and" circuit II*a* acts to produce an "or" output.

The "and" circuit II*a* so far described and illustrated comprises a first matrix $M_1$ to which the timing pulses T1 to T8 are directly applied from the timing pulse generator 6 and a pair of second matrices $M_2$ and $M_2'$ to which respective input signals representing the operation of relevant character keys are applied through the first and second group terminals 4 and 5. It is to be noted that the output lines $B_1$ to $B_{16}$ correspond to the character keys disposed on the keyboard 1.

In the matrix $M_2$, the output lines $B_1$ to $B_8$ are adapted to produce respective outputs upon the application of an input signal thereto by means of the group terminal 4 on the input line $A_9$ while the output lines $B_9$ to $B_{16}$ are adapted to produce respective outputs upon the application of an input signal through an inverter 11. On the other hand, in the matrix $M_2'$, the output lines $B_1$ to $b_8$ are adapted to produce respective outputs upon the application of an input signal through an inverter 12 while the output lines $B_9$ to $B_{16}$ are adapted to produce respective outputs upon the application of an input signal by means of the group terminal 5.

In the arrangement as hereinbefore fully described, if the timing pulse generator 6 is in the operative condition and one of the character keys of the first group, for example, the "1" character key, is eventually operated, the corresponding key contact $C_1$ will be closed to permit the timing pulse T1 to be applied to the output line $B_1$ within the output lines $B_1$ to $B_8$ through respective diode 9 by means of the input line $A_9$. On the other hand, since all of the contacts $C_9$ to $C_{16}$ of the second group are left open at this time, no timing pulse can be applied through the group terminal 5 to the input line $A_{11}$.

However, the inverter 12 at this time generates an input signal to the input line $A_{12}$ which is in turn fed to the output lines $B_1$ to $B_8$ through respective diodes 9. Thus, it will be understood that an output of the "and" circuit IIa can be obtained through the output line $B_1$ by these three inputs because the three diodes *a*, *b* and *c* are cut off. This output is in turn utilized to produce a binary coded signal representative of the decimal digit "1" on a ($2^0$) binary line. However, this output of the "and" circuit II*a* is also applied to a (E) line of the "or" circuit II*b;* a signal present on this line merely acts to represent the operation of any of the figure keys or key contacts $C_1$ to $C_{10}$.

Alternatively, if one of the character keys of the second group, for example, the 0" figure key, is operated, the corresponding key contact $C_{10}$ will be closed to permit the timing pulse T2 to be applied to the output line $B_{10}$ within output lines $B_9$ to $B_{16}$ while the timing pulse T2 on the input line $A_2$ of the first matrix $M_1$ is applied to the output lines $B_2$ and $B_{10}$ through respective diodes 9. On the other hand, since all of the contacts $C_1$ to $C_8$ of the first group are left open at this time, no timing pulse can be applied through the group terminal 4 to the input line $A_9$. However, the inverter 11 at this time generates an input signal to the input line $A_{10}$ which is in turn fed to the output lines $B_9$ to $B_{16}$ through respective diodes 9. Thus, it will be understood that an output of the "and" circuit IIa can be obtained by these three inputs through the output line $B_{10}$. Of course, the output of the "and" circuit IIa is then utilized to produce a binary coded signal representative of the decimal digit "0" on the (E) line.

The output thus produced by the "or" circuit II*b*, i.e., binary coded signals within a four-binary frame representing a decimal digit that has been entered in the calculator, is adapted to be supplied through "and" gates 13, 14, 15 and 16 to a flip-flop circuit for storing it for a while which is in turn supplied to an arithmetic circuit (not shown).

Although the present invention has been fully described in connection with a preferred embodiment thereof, various modification and change are apparent to those skilled in the art. For example, in the case where the keyboard 1 comprises, for example, 24 character keys, the second matrix may be provided with three matrices instead of the matrices $M_2$ and $M_2'$. In this case, it is only necessary to design such that eight output lines corresponding to eight character keys are adapted to receive the timing pulses directly while the remaining sixteen output lines are adapted to receive input signals through respective inverters.

Furthermore, it is to be noted that the present invention can be applied not only in the electronic calculator of the character above referred to, but also in a cash register or the like.

I claim:

1. An input encoding system for use in an electronic calculating machine comprising a keyboard having a plurality of character keys; a plurality of key contacts each operable by the corresponding character key, said key contacts being divided into at least two groups according to the number of timing pulses employed during one step of operation, the number of contacts within each group consisting of not more than the number of said timing pulses, to provide the corresponding number of group terminals; means for supplying said timing pulses; a first matrix to which said pulses are directly applied; a plurality of second matrices, the number of which corresponds to the number of groups of the key contacts, each having a pair of input lines, means connected to one of said input lines of said second matrices, for applying said input line directly with an input signal from one of the key contacts that has been operated and for producing output signals on output lines corresponding to the character keys of the relevant group, while the other of said input lines of said second matrices includes means for directly applying said other input lines with an input signal through respective inverters and for producing output signals on output lines corresponding to the character keys of the other groups, whereby a logical product of output signals from said first and second matrices can be obtained; and a third or encoder matrix capable of receiving said logical product to thereby generate binary coded signals representative of one character that has been entered in the calculating machine.

2. The input encoding system according to claim 1, including means for applying said timing pulses to a read-out means of a display device.

3. An input encoding apparatus comprising:
- means for generating a first predetermined number of sequentially spaced timing pulses within a specified period of time;
- a keyboard having a number of character keys thereon, said number of keys being an integral multiple of said predetermined number of timing pulses to form a plurality of groups of keys, each group simultaneously receiving each timing pulse as generated;
- a plurality of key switches, each having a conductive contact capable of bridging a pair of terminals for supplying a selected one of said predetermined number of said timing pulses therethrough when closed, corresponding to said plurality of character keys;
- means, responsive to the coincident receipt of one of said timing pulses directly and through one of said key switches, for generating a first output signal; and
- means, responsive to receipt of a first output signal, for converting said output signal into an output encoded signal.

4. An apparatus according to claim 3, wherein said means for generating a first output signal includes means responsive to the coincidence of one of said timing pulses and the closure of said key switch the numerical position of said switch within said number of key switches corresponding to the numerical position of said one of said sequentially generated time pulses.

5. An input encoding apparatus comprising:
- means for generating a first predetermined number of sequentially spaced timing pulses with a specified period of time;
- a keyboard having a number of character keys thereon, said number of keys being an integral multiple of said predetermined number of timing pulses;
- a plurality of key switches, each having a conductive contact and a pair of terminals for supplying an electric potential therethrough when closed, corresponding to said plurality of character keys;
- means, responsive to the coincident generation of one of said timing pulses with the closure of one of said key switches, for generating a first output signal comprising:
- a first plurality of AND gates, one input of each of said first plurality of AND gates being connected to receive said sequentially generated timing pulses and at least a second input of each of which is connected in common to at least one plurality of key switches, the number of key switches in said plurality being equal to said first predetermined number of spaced timing pulses, the numerical position of said switch within said number of key switches corresponding to the numerical position of said one of said sequentially generated time pulses; and
- means, responsive to receipt of a first output signal, for converting said output signal into an output encoded signal.

6. An apparatus in accordance with claim 5, wherein said first plurality of AND gates comprises a first diode matrix having orthogonally arranged branches, each branch in one of said orthogonally arranged branches being connected to a source of common reference potential and each respective branch in second orthogonally arranged branches being respectively connected to receive said first predetermined number of sequentially spaced timing pulses.

7. An input encoding apparatus comprising:
- means for generating a first predetermined number of sequentially spaced timing pulses within a specified period of time;
- a keyboard having a number of character keys thereon, said number of keys being an integral multiple of said predetermined number of timing pulses;
- a plurality of key switches, each having a conductive contact and a pair of terminals for supplying an electric potential therethrough when closed, corresponding to said plurality of character keys;
- means, responsive to the coincident generation of one of said timing pulses with the closure of one of said key switches, for generating a first output signal comprising:
- first and second pluralities of AND gates, a first output of each of said AND gates in each of said pluralities being respectively connected to receive said sequentially generated timing pulses, a second input in said first plurality of AND gates being connected in common to a first plurality of key switches, the number of which corresponds to said first predetermined number of spaced timing pulses, and a third input of said first plurality of AND gates being connected in common to the inverted output of a second plurality of key switches, the number of which corresponds to said first predetermined number of spaced timing pulses, the numerical position of said switch within said number of key switches corresponding to the numerical position of said one of said sequentially generated time pulses; and means, responsive to receipt of a first output signal, for converting said output signal into an output encoded signal.

8. An apparatus in accordance with claim 7, wherein said second plurality of AND gates has a first input of each gate being connected in parallel with the respective first inputs of said first plurality of AND gates, the second inputs of said second plurality of AND gates being connected in common to the inverted output of said first plurality of key switches, and the third input of said second plurality of AND gates being connected in common to said second plurality of key switches.

9. An apparatus in accordance with claim 8, wherein said encoding means comprises a matrix OR circuit connected to the outputs of each of said pluralities of AND gates in accordance with a predetermined encoding pattern.

10. An apparatus in accordance with claim 9, wherein said encoding means further comprises an additional plurality of AND gates, an input each of which is connected to each respective output of encoding OR matrix and a separate output of each of which is connected to receive a second predetermined number of timing pulses.

11. An apparatus in accordance with claim 10, further including a display device coupled to said timing pulse generator to receive each of said respective first predetermined number of timing pulses.

* * * * *